United States Patent [19]

Araseki

[11] 4,191,858
[45] Mar. 4, 1980

[54] BLOCK DIGITAL PROCESSING SYSTEM FOR NONUNIFORMLY ENCODED DIGITAL WORDS

[75] Inventor: Takashi Araseki, Tokyo, Japan

[73] Assignee: Nippon Electric Co., Ltd., Tokyo, Japan

[21] Appl. No.: 913,271

[22] Filed: Jun. 7, 1978

[30] Foreign Application Priority Data

Jun. 7, 1977 [JP] Japan .................................. 52-67739

[51] Int. Cl.² ......................................... H03K 13/22
[52] U.S. Cl. ............................ 179/15.55; 340/347 DD
[58] Field of Search .......... 340/347 DD; 179/15 AV, 179/15.55 R, 15.55 T, 1 VL

[56] References Cited

U.S. PATENT DOCUMENTS

| | | | |
|---|---|---|---|
| 3,789,392 | 1/1974 | Candiani | 340/347 DD |
| 3,798,635 | 3/1974 | Candiani | 340/347 DD |
| 3,945,002 | 3/1976 | Duttweiler | 340/347 DD |
| 4,040,049 | 8/1977 | Messerschmitt | 179/15 AV |

*Primary Examiner*—Charles E. Atkinson
*Assistant Examiner*—E. S. Kemeny
*Attorney, Agent, or Firm*—Sughrue, Rothwell, Mion, Zinn and Macpeak

[57] ABSTRACT

This data compression system further reduces previously-formed digital words representing samples of nonuniformly quantized and encoded analog speech, by normalizing and reencoding the original input digital word samples into smaller words using block coding wherein the input words are bit-reduced by normalizing a block of samples to the maximum amplitude sample value. Features of the invention include concatenating the most significant bit of the maximum value block code (first digital word) with the least significant bit of the segment bits part of the normalized input digital word (third digital word).

8 Claims, 9 Drawing Figures

| BLOCK CODE | ORIGINAL WORD | NORMALIZED WORD | NIC CODE | DECODED WORD | RECONSTRUCTED WORD |
|---|---|---|---|---|---|
| 1111 | s1111x | — | s11x | s1111x | — |
|  | s1110x | — | s10x | s1110x | — |
|  | s1101x | — | s011 | s11011 | — |
|  | s1100x | — | s010 | s11001 | — |
|  | s1011x | — | s001 | s10110 | — |
|  | s1010x | — | s001 | s10110 | — |
|  | s1001x | — | s000 | s10000 | — |
|  | ⋮ | ⋮ | ⋮ | ⋮ | ⋮ |
| 1110 | s1110x | s1111x | s11x | s1111x | s1110x |
|  | s1101x | s1110x | s10x | s1110x | s1101x |
|  | s1100x | s1101x | s011 | s11011 | s11001 |
|  | s1011x | s1100x | s010 | s11001 | s10111 |
|  | s1010x | s1011x | s001 | s10110 | s10100 |
|  | s1001x | s1010x | s001 | s10110 | s10100 |
|  | s1000x | s1001x | s000 | s10000 | s01110 |
| 1101 | s1101x | — | s11x | s1101x | — |
|  | s1100x | — | s10x | s1100x | — |
|  | s1011x | — | s011 | s10111 | — |
|  | s1010x | — | s010 | s10101 | — |
|  | s1001x | — | s001 | s10010 | — |
|  | s1000x | — | s001 | s10010 | — |
|  | s0111x | — | s000 | s01100 | — |
|  | ⋮ | ⋮ | ⋮ | ⋮ | ⋮ |

| | | | | | |
|---|---|---|---|---|---|
| 1100 | s1100x<br>s1011x<br>s1010x<br>s1001x<br>s1000x<br>s0111x<br>s0110x | s1101x<br>s1100x<br>s1011x<br>s1010x<br>s1001x<br>s1000x<br>s0111x | s11x<br>s10x<br>s011<br>s010<br>s001<br>s001<br>s000 | s1101x<br>s1100x<br>s10111<br>s10101<br>s10010<br>s10010<br>s01100 | s1100x<br>s1011x<br>s10101<br>s10011<br>s10000<br>s10000<br>s01010 |
| 1011 | s1011x<br>s1010x<br>s1001x<br>s1000x<br>s0111x<br>s0110x<br>s0101x | —<br>—<br>—<br>—<br>—<br>—<br>— | s11x<br>s10x<br>s011<br>s010<br>s001<br>s001<br>s000 | s1011x<br>s1010x<br>s10011<br>s10001<br>s01110<br>s01110<br>s01000 | —<br>—<br>—<br>—<br>—<br>—<br>— |
| 1010 | s1010x<br>s1001x<br>s1000x<br>s0111x<br>s0110x<br>s0101x<br>s0100x | s1011x<br>s1010x<br>s1001x<br>s1000x<br>s0111x<br>s0110x<br>s0101x | s11x<br>s10x<br>s011<br>s010<br>s001<br>s001<br>s000 | s1011x<br>s1010x<br>s10011<br>s10001<br>s01110<br>s01110<br>s01000 | s1010x<br>s1001x<br>s10001<br>s01111<br>s01100<br>s01100<br>s01110 |

FIG 3c

| | | | | | |
|---|---|---|---|---|---|
| 1001 | s1001x | — | s11x | s1001x | — |
| | s1000x | — | s10x | s1000x | — |
| | s0111x | — | s011 | s01111 | — |
| | s0110x | — | s010 | s01101 | — |
| | s0101x | — | s001 | s01010 | — |
| | s0100x | — | s001 | s01010 | — |
| | s0011x | — | s000 | s00100 | — |
| | ⋮ | ⋮ | ⋮ | ⋮ | ⋮ |
| 1000 | s1000x | s1001x | s11x | s1001x | s1000x |
| | s0111x | s1000x | s10x | s1000x | s0111x |
| | s0110x | s0111x | s011 | s01111 | s01101 |
| | s0101x | s0110x | s010 | s01101 | s01011 |
| | s0100x | s0101x | s001 | s01010 | s01000 |
| | s0011x | s0100x | s001 | s01010 | s01000 |
| | s0010x | s0011x | s000 | s00100 | s00010 |
| | ⋮ | ⋮ | ⋮ | ⋮ | ⋮ |
| 0111 | s0111x | — | s11x | s0111x | — |
| | s0110x | — | s10x | s0110x | — |
| | s0101x | — | s011 | s01011 | — |
| | s0100x | — | s010 | s01001 | — |
| | s0011x | — | s001 | s00110 | — |
| | s0010x | — | s001 | s00110 | — |
| | s0001x | — | s000 | s00010 | — |

| | | | | | |
|---|---|---|---|---|---|
| 0110 | s 0110 x<br>s 0101 x<br>s 0100 x<br>s 0011 x<br>s 0010 x<br>s 0001 x<br>s 0000 x | s 0111 x<br>s 0110 x<br>s 0101 x<br>s 0100 x<br>s 0011 x<br>s 0001 x<br>s 0000 x | s 1 1 x<br>s 1 0 x<br>s 011<br>s 010<br>s 001<br>s 000<br>s 000 | s 0111 x<br>s 0110 x<br>s 01011<br>s 01001<br>s 00110<br>s 00010<br>s 00010 | s 0110 x<br>s 0101 x<br>s 01001<br>s 00111<br>s 00100<br>s 00010<br>s 00010 |
| 0101 | s 0101 x<br>s 0100 x<br>s 0011 x<br>s 0010 x<br>s 0001 x<br>s 0000 x | —<br>—<br>—<br>—<br>—<br>— | s 1 1 x<br>s 1 0 x<br>s 011<br>s 010<br>s 001<br>s 000 | s 0101 x<br>s 0100 x<br>s 00111<br>s 00101<br>s 00011<br>s 00001 | —<br>—<br>—<br>—<br>—<br>— |
| 0100 | s 0100 x<br>s 0011 x<br>s 0010 x<br>s 0001 x<br>s 0000 x | s 0101 x<br>s 0100 x<br>s 0011 x<br>s 0001 x<br>s 0000 x | s 1 1 x<br>s 1 0 x<br>s 011<br>s 001<br>s 000 | s 0101 x<br>s 0100 x<br>s 00111<br>s 00011<br>s 00001 | s 0100 x<br>s 0011 x<br>s 00101<br>s 00011<br>s 00001 |
| 0011 | s 0011 x<br>s 0010 x<br>s 0001 x<br>s 00001<br>s 00000 | —<br>—<br>—<br>—<br>— | s 1 1 x<br>s 1 0 x<br>s 0 1 x<br>s 001<br>s 000 | s 0011 x<br>s 0010 x<br>s 0001 x<br>s 00001<br>s 00000 | —<br>—<br>—<br>—<br>— |
| 0010 | s 0010 x<br>s 0001 x<br>s 00001<br>s 00000 | s 0011 x<br>s 0001 x<br>s 00001<br>s 00000 | s 1 1 x<br>s 0 1 x<br>s 001<br>s 000 | s 0011 x<br>s 0001 x<br>s 00001<br>s 00000 | s 0010 x<br>s 0001 x<br>s 00001<br>s 00000 |
| 0001 | s 0001 x<br>s 00001<br>s 00000<br>s 00000 | —<br>—<br>—<br>— | s 1 x y<br>s 0 1 y<br>s 001<br>s 000 | s 0001 x<br>s 00001<br>s 00000<br>s 00000 | —<br>—<br>—<br>— |
| 0000 | s 00001<br>s 00000<br>s 00000 | s 00001<br>s 00000<br>s 00000 | s 1 y z<br>s 0 1 z<br>s 0 0 z | s 00001<br>s 00000<br>s 00000 | s 00001<br>s 00000<br>s 00000 |

BLOCK DIGITAL PROCESSING SYSTEM FOR NONUNIFORMLY ENCODED DIGITAL WORDS

BACKGROUND OF THE INVENTION

The present invention relates to a system for encoding and/or decoding a plurality of samples of a speech signal in a lump or block unit and more particularly, to a block digital processing system for nonuniformly encoded digital words for use in various communications systems such as a PCM telephone exchange system or the like.

The transmission of analog signals such as a speech signal and a video signal can be efficiently achieved in digital form through band compression utilizing the inherent redundancy of these signals. This redundancy is attributed to the fact that an amplitude distribution of a speech signal is nonuniform and that there is a correlation between the speech signals. A band compression technique using the redundancy based on the former reason is known as a quantizing technique or a variable length encoding technique. Also, a band compression technique resorting to the latter reason is known as a DPCM (differential pulse code modulation) or delta modulation technique.

A block digital processing system for nonuniformly encoded digital words performs band compression using the redundancy caused by the above-mentioned two reasons, in which the band compression is achieved by converting samples of a speech signal into nonuniformly encoded digital words each of which is represented by a sign bit to indicate a polarity of the sample, segment bits to indicate a range to which said amplitude value of the sample belongs, and mantissa bits to indicate at what location in said range said amplitude value exists, reencoding said digital words through the uniform quantization in the block unit of a predetermined number of samples, and transmitting a block code to indicate the step size of the quantization levels (abbreviated hereunder as the step size) and said reencoded codes.

For details of such a system, reference is made to U.S. Pat. No. 3,945,002. In the system of FIG. 1 of that Patent, a transmitter digital processor comprises shift registers (111~118) for storing and delaying nonuniformly encoded input digital words corresponding to samples of a speech signal by an integral multiple of the speech sampling period (one block period), a maximum detector (121~126) for detecting a sample value having the maximum amplitude in one block of said nonuniformly encoded digital words, an encoder (133, 149, 152~157 and 160) for reencoding output digital words given from said shift registers through the uniform quantization according to the step size determined by said maximum value, and a multiplexer (190) for combining the output codes fed from said encoder and a block code to indicate information relating to said step size and transmitting the combined codes through a transmission line, while a receiver digital processor comprises a demultiplexer (290) for separating the output codes of the encoder and the block code given from the output codes of said transmitter digital processor, and decoders (233, 255, 271, 272, 260) for decoding said output codes of the encoder into said nonuniformly encoded input digital words on the basis of the step size indicated by said block code.

However, in this conventional system, the step sizes in the encoder and decoder are preset at 6 dB (decibels) intervals, and as a result, this system allows the valleys of 6 dB to arise in the S/N (signal-to-noise) characteristics representing the relationship between the S/N ratio and the input signal amplitude (dB) relative to a full load when a sinusoidal wave signal is given as the input signal, deteriorating the S/N ratio greatly and resulting in degradation of the performance of the system. On the other hand, setting the step size more finely by adopting the prior art construction for the purpose of eliminating this shortcoming results in the system becoming bulky and costly.

SUMMARY OF THE INVENTION

The present system includes a transmitter digital processor for encoding samples of a speech signal in the block unit of a predetermined number of samples, and a receiver digital processor for decoding said encoded digital words into said speech signal. The transmitter digital processor comprises a plurality of input terminals adapted to receive nonuniformly encoded digital words which have been obtained by preliminarily encoding the respective samples of said speech signal and each of which consists of a sign bit to indicate a polarity of said sample, a plurality of segment bits to indicate a range to which the amplitude value of said sample belongs and a plurality of mantissa bits to indicate at what location in said segment said amplitude value exists. A shift register is connected to said input terminals for delaying said digital words by a period of n times the sampling period of said speech signal to temporarily store said samples equal in number to n (n being an integer). A maximum value detector is connected to the shift register for detecting a first digital word indicating the maximum amplitude value among said n digital words representing said samples stored in the shift register. The maximum value detector generates a correction value used for converting a second digital word into a third digital word. The second digital word includes a block code consisting of said segment bits and at least the most significant bit of said mantissa bits in said first digital word representative of the maximum amplitude value. The third digital word includes said segment bits in said first digital word representative of the maximum amplitude value and which includes a maximum value that can be represented by said at least the most significant bit in said first digital word and that is concatenated subsequently to the least significant bit of said segment bits. Normalizing means is connected to the shift register for converting the output digital word given from the shift register into a normalized digital word with said correction value. A reencoder responsive to said third digital word from said normalizing means uniformly quantizes said third digital word, and a multiplexer transmits the output code of said reencoder means and said block code in a multiplex fashion. The receiver digital processor comprises a demultiplexer for separating the output code of the reencoder and said block code from the multiplexed code that is transmitted from the transmitter digital processor. A register stores said block code, and a decoder decodes the output code of the reencoder by making use of the segment bits in said block code. The correction value generated in the transmitter digital processor in detected, and inverse normalizing means connected to the decoder inversely normalizes the output digital word of the decoder with said correction value.

BRIEF DESCRIPTION OF THE DRAWINGS

Now the present invention will be described in greater detail in conjunction with the accompanying drawings, in which:

FIGS. 3a–3d show a table for explaining the operation of the first embodiment;

DESCRIPTION OF THE PREFERRED EMBODIMENTS

Figure 1:
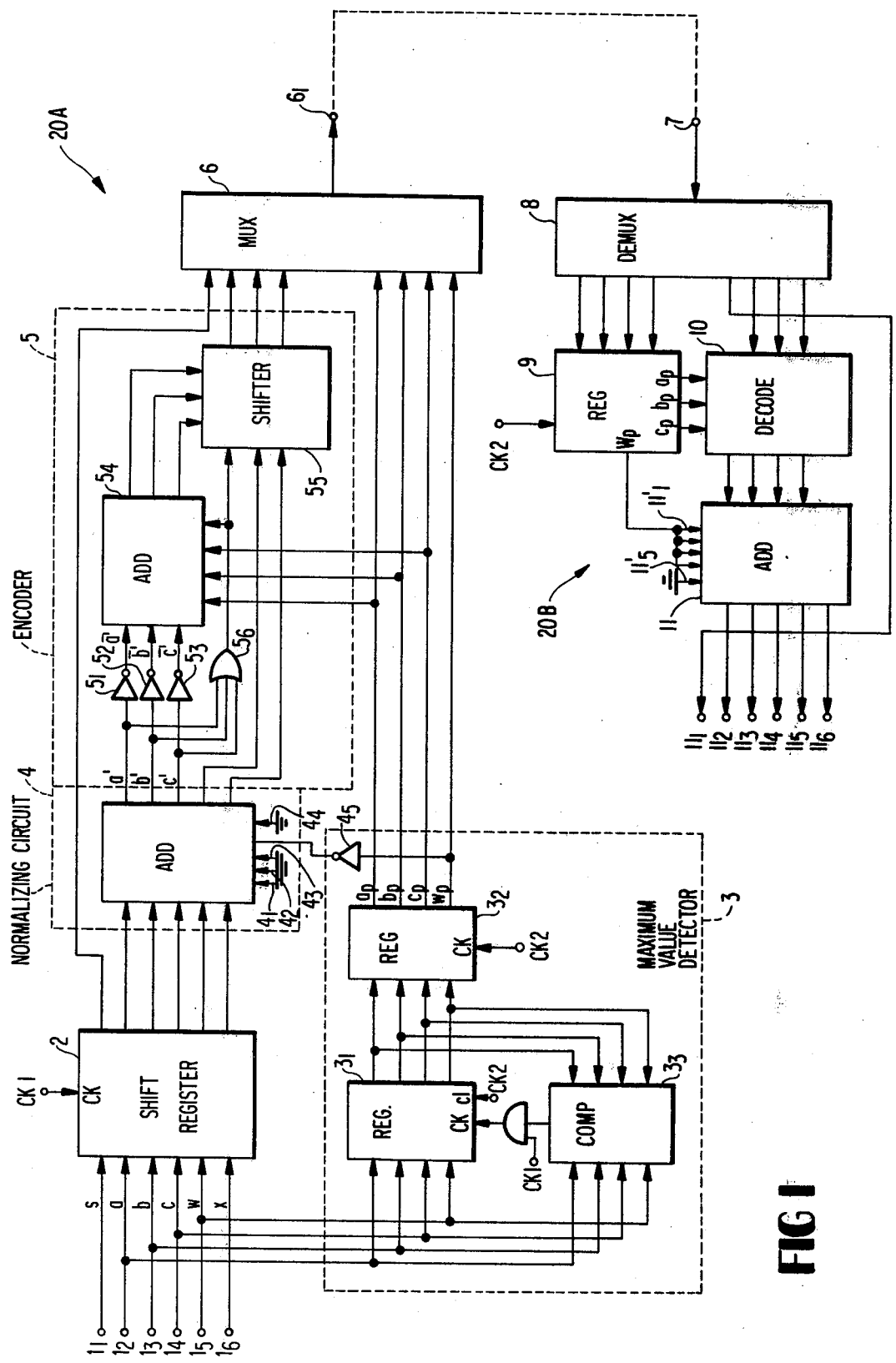
FIG. 1 shows a block diagram of a first embodiment of the present invention.

In FIG. 1, the first embodiment includes a transmitter digital processor 20A and a receiver digital processor 20B. The processor 20A comprises input terminals $1_1 \sim 1_6$ adapted to receive nonuniformly encoded digital words which have been obtained by preliminarily encoding respective samples of a speech signal according to the 6-bit μ-law and each of which consists of 6 bits including a sign bit s, segment bits a, b, and c, and mantissa bits w and x (original words in FIG. 3); a shift register 2 for storing and delaying these input digital words by 1 block (20 samples in the illustrated embodiment); and a maximum value detector 3 including a register $3_1$ and a comparator $3_3$ to which the four most significant bits except for the sign bit in said input digital word are given for detecting a sample having the maximum amplitude in one block of samples. This detector 3 further comprises another register $3_2$ for storing the detected sample value having the maximum amplitude as a block code $a_p b_p c_p w_p$ (block codes in FIG. 3) to determine the step size of the quantization levels for reencoding as described later.

Thus, a block code representing the maximum value of the samples in one block is composed of 4 bits, while said step size is represented by 3 bits similarly to the prior art system. In addition, the transmitter digital processor 20A comprises a normalizing circuit 4 consisting of an adder adapted to add a correction value of "00010" generated by correction value generating means consisting of an inverter $4_5$ and a group of wires $4_1 \sim 4_4$ to 5 bits other than the sign bit in the 6-bit output digital word delivered from the shift register 2 when the $w_p$ bit contained in the block code is binary "0" while to add a correction value of "00000" to the same 5 bits in the output digital word when the $w_p$ bit is binary "1". An encoder 5 reencodes the output digital word delivered from this normalizing circuit (normalized words in FIG. 3) according to the uniform quantization on the basis of the step size determined by the three more significant bits $a_p$, $b_p$ and $c_p$ in the block code, and a multiplexer 6 combines the output code given from the encoder 5 (nearly instantaneous companded codes or NIC codes in FIG. 3) and the block code and transmits them from an output terminal $6_1$ through a transmission line. This encoder 5 is comprised of inverters $5_1 \sim 5_3$ for inverting the three more significant bits a', b' and c', respectively, in the output of the normalizing circuit 4, an adder $5_4$ for obtaining the sum of the three more significant bits $a_p$, $b_p$ and $c_p$ in the block code and output signals $\overline{a'}$, $\overline{b'}$ and $\overline{c'}$ given from the inverters $5_1 \sim 5_3$, and a shifter $5_5$ for receiving the output signal of said adder $5_4$ as a shift control signal and for shifting the w and x bits in an input digital word and an output signal (given from an OR circuit $5_6$ described later) representative of information to obtain the more significant bit than the w bit in the input signal by the use of said shift control signal. Here, it should be noted that as is apparent from the table of FIG. 4 of U.S. Pat. No. 3,945,002, in the case where the block code is less than three (of decimal notation) and segment bits of small value in the decimal notation such as "000" and "001", respectively, are reencoded, the shift numbers given for reencoding these signals are equal to each other. Also, it should be noted that if the segment bits other than "000" are given, binary "1" appears at the more significant bit position than the w bit in the NIC code, while if the segment bits are "000", binary "0" exists at the more significant bit position that the w bit in the NIC code. To perform these operations, the encoder 5 of the present invention includes an OR circuit $5_6$, which generates a control signal for the adder $5_4$ such that when all the segment bits a', b' and c' forming the three more significant bits of the output signal of the normalizing circuit 4 are "000", the adder $5_4$ may produce an output signal equal to that produced by the segment bits brought to "001", and a signal for giving the more significant bit than the w and x bits to be given to the shifter $5_5$.

Meanwhile, the receiver digital processor 20B comprises an input terminal 7 adapted to receive an output code given from the transmitter digital processor 20A, a demultiplexer 8 for separating the received output code into the block code ($a_p$, $b_p$, $c_p$, $w_p$) and the NIC code, a register 9 applied with the separated block code for generating one address of a decoder 10, the decoder 10 consisting of a read-only-memory (ROM) having a predetermined decoding rule for decoding the NIC code into the input digital word stored therein which is addressed by the three more significant bits ($a_p$, $b_p$, $c_p$) in said register 9 and the NIC code except for the sign bit, and an inverse normalizing circuit 11 consisting of an adder which subtracts a correction value "00010" generated by correction value detecting means formed of wirings $11_1' \sim 11_5'$ from the decoded output digital word (decoded words in FIG. 3) of the decoder 10 when the remaining one bit ($w_p$) in said register 9 is "0", and subtracts a correction value "00000" when the bit $w_p$ is "1". The word obtained after the correction value "00010" has been subtracted in the inverse normalizing circuit 11 is represented as "reconstructed word" in the table shown in FIG. 3, and it is delivered at output terminals $11_1 \sim 11_6$. The shifter $5_5$ may be composed of SIGNETICS-8243 shown on page 270 of "SIGNETICS DATA MANUAL" published in 1976 by Signetics Corporation. With regard to the shift register 2, registers $3_1$ and $3_2$, comparator $3_3$, multiplexer 6 and demultiplexer 7, those illustrated in FIGS. 1 and 2 of U.S. Pat. No. 3,945,002 can be employed. Therefore, more detailed description of these units will be omitted. Also, since the adders 4 and 5 and the ROM 10 are well known detailed description of these units will be omitted.

Figure 2:
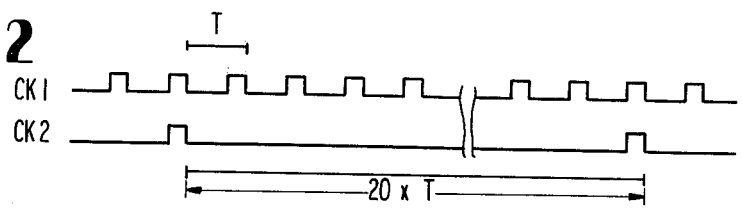
FIG. 2 shows a waveform diagram of clock timing for operating the system shown in FIG. 1.

The shift register 2, the registers $3_1$, $3_2$ and 9 of the present system are operated by two kinds of clocks CK1 and CK2 (FIG. 2) fed from a clock supply means (not shown). In FIG. 2, reference character T represents a sampling period (=125 microseconds) for a speech signal.

Figure 4:
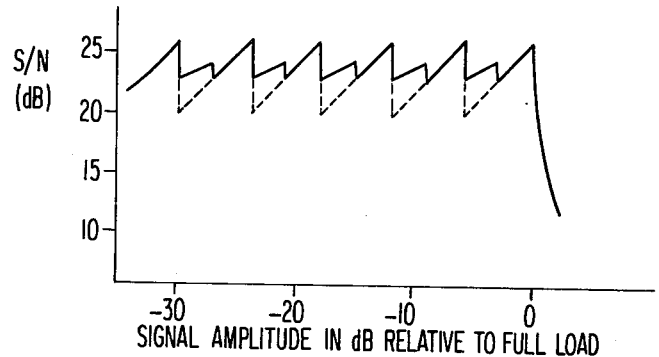
FIG. 4 shows an S/N performance diagram for representing an advantage of the present invention.

FIG. 4 shows a comparison result between the S/N characteristics of the present system (solid line) and those of the prior art system (broken line), taking an input signal amplitude value relative to a full load along the abscissa and the S/N ratio along the ordinate when a nonuniformly encoded sinusoidal wave of 6 bits is given as an input digital word. As will be apparent from this figure, in contrast to the prior art system where valleys appear at every 6 dB in the S/N characteristics, the present invention allows the valleys to appear at about every 3 dB owing to the normalizing circuit 4, resulting in the improvement in the S/N characteristics by about 2 dB.

While μ-law nonuniformly coded digital words are used as an input signal in the embodiment, A-law nonuniformly coded digital words may be used as well, and input digital words having a different number of bits can be employed. For further details of the operations for converting a linear signal into nonuniformly encoded words depending on the A-law or μ-law and for making the conversion inverse to said conversion, reference is made to Kaneko, "A Unified Formulation of Segment Companding Laws and Synthesis of Codes and Digital Companders", *The Bell System Technical Journal*, Vol. 49, No. 7, September 1970, pp. 1555–1588.

In addition, while a correction value is added in the normalizing circuit 4 in the embodiment, a structure such that a correction value is subtracted therein may be adopted. However, in such a modified case, it is to be noted that the interpretation of the block code is different, and that for a low-level signal, the reencoding operation must be carried out by employing a predetermined rule different from that met by the NIC code in FIG. 3. Here, it is seen that although the degree of the S/N ratio-improvement must be 3 dB in principle when the bit length of the block code is increased by one bit, in the embodiment the degree of the S/N ratio improvement is only about 2 dB for the increase of said bit length as will be easily understood from FIG. 4. This is due to the fact that the above-mentioned A-law and μ-law are based on the piecewise linear approximation to a logarithmic function. Therefore, taking the piecewise linear approximation into consideration, the S/N ratio can be slightly improved with respect to the embodiment by employing a normalizing circuit in which different correction values are obtained for the respective sample values in one block and the addition or subtraction of these correction values is performed for the purpose of correction. However, if the NIC code includes 6 bits, the above-mentioned modification will result in little advantage.

Figure 5:
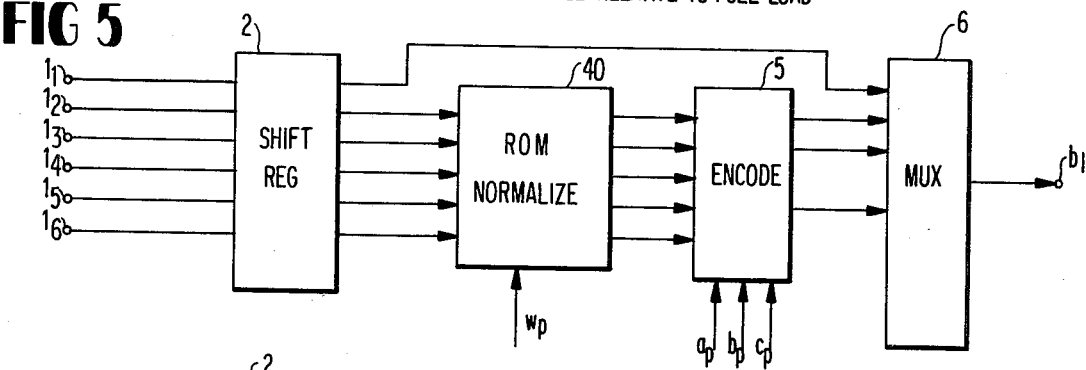
FIG. 5 shows a block diagram of a second embodiment of the present invention.

In FIG. 5, a second embodiment of the present invention includes said modified normalizing circuit. This normalizing circuit is composed of an ROM 40 addressed by an output word given from a shift register 2 and a $w_p$ bit in the register $3_2$ in FIG. 1. The ROM 40 stores a prdetermined rule such that when the $w_p$ bit in the register $3_2$ is "1", the applied digital word is given directly an encoder 5, whereas when the $w_p$ bit is "0", the applied digital word is subjected to correction so as to be equal to a uniform digital word that has been uniformly converted from the applied digital word, multiplied by a factor of 4/3, and is then fed to the encoder 5. An inverse normalizing circuit 10 of a receiver digital processor in the case of employing such a normalizing circuit, is composed of an ROM for performing an operation inverse to the normalizing circuit 40.

Figure 6:
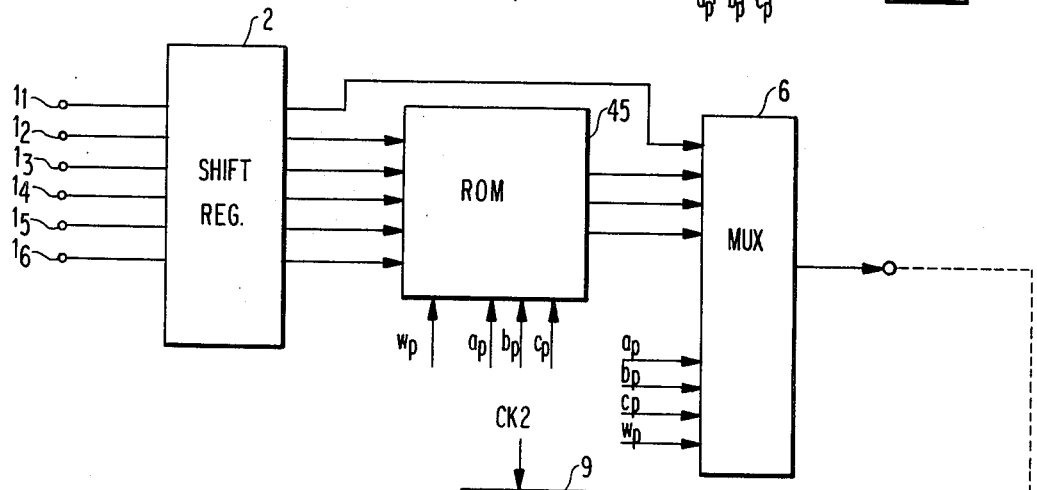
FIG. 6 shows a block diagram of a third embodiment of the present invention.
Figure 6:
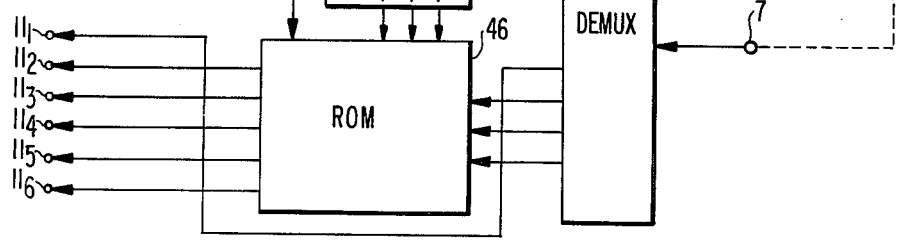

In FIG. 6 which shows a third embodiment of the present invention, the present system includes a processor circuit 45 consisting of an ROM which has the two functions of the normalizing circuit 4 or 40 and of the encoder 5, and an inverse processor circuit 46 consisting of an ROM which has the two functions of the inverse normalizing circuit 11 and of the decoder 10. The ROM 45 stores values corresponding to the NIC codes which can be obtained by normalizing the output digital words given from the register 2 depending on the values of the $w_p$ bit in the block codes and then by reencoding the normalized words according to the uniform quantization, and these memory contents can be read out as addressed by the input digital words and the block codes. On the other hand, the ROM 46 stores values corresponding to the digital words which can be obtained by decoding the inputted NIC codes and thereafter by normalizing the decoded words depending on the values of the $w_p$ bit in the block codes.

As has been mentioned above, the present invention performs the normalization of the input nonuniformly encoded digital words and the reencoding operation using the uniform quantization technique and the simpler circuit structure, improving the S/N ratio greatly. Also, the present invention can be easily applied to various communications systems aimed at band compression, especially to PCM telephone exchange systems and DSI (digital speech interpolation) systems.

What is claimed is:

1. A block digital processing system for nonuniformly encoded digital words including a transmitter digital processor for encoding samples of a speech signal in blocks of a predetermined number of samples, and a receiver digital processor for decoding said encoded digital words into said speech signal, wherein said transmitter digital processor comprises:

a plurality of input terminals adapted to receive nonuniformly encoded digital words which have been obtained by preliminarily encoding the respective samples of said speech signal and each of which consists of a sign bit to indicate the polarity of said sample, a plurality of segment bits to indicate a range to which the amplitude value of said sample belongs and a plurality of mantissa bits to indicate at what location in said segment said amplitude value exists;

shift register means connected to said input terminals for delaying said digital words by a period of n times the sampling period of said speech signal to temporarily store said samples equal in number to said n (n being an ineger);

a maximum value detector connected to said shift register means for detecting a first digital word indicating the maximum amplitude value among said n digital words representing said samples and stored in said shift register means;

means connected to said maximum value detector for generating a correction value so that a second digital word consisting of said segment bits and at least the most significant bit of said mantissa bits from said shift register means can be converted into a third digital word which includes said segment bits in said first digital word representative of the maximum amplitude value and which includes a maximum value that can be represented by said at least the most significant bit in said first digital word and that is concatenated subsequently to the least significant bit of said segment bits;

normalizing means receiving said correction value and connected to said shift register means for converting the second digital word given from said shift register means into a normalized digital word with said correction value;

reencoder means responsive to said third digital word from said normalizing means for uniformly quantizing said third digital word; and a multiplexer for transmitting the output code of said reencoder means and said block code in a multiplex fashion.

2. A block digital processing system for nonuniformly encoded digital words as claimed in claim 1, in which said receiver digital processor comprises a demultiplexer for separating the output code of said reencoder means and said block code from the multiplexed code that is transmitted from said transmitter digital processor, register means for storing said block code, decoder means for decoding the output code of said reencoder means using the segment bits in said block code, means connected to said register means for detecting the correction value generated in said transmitter digital processor, and inverse normalizing means connected to said decoder means for inversely normalizing the output digital word of said decoder means with said correction value.

3. A block digital processing system for nonuniformly encoded digital words as claimed in claim 1, in which said means for generating the correction value, said normalizing means and said encoding means are jointly composed of a single read-only memory.

4. A block digital processing system for nonuniformly encoded digital words as claimed in claim 2, in which said correction value detecting means, said inverse normalizing means and said decoding means are jointly composed of a single read-only memory.

5. A block digital processing system for nonuniformly encoded digital words as claimed in claim 1, in which said normalizing means is composed of an adder.

6. A block digital processing system for nonuniformly encoded digital words as claimed in claim 1, in which said normalizing means is composed of a read-only memory.

7. A block digital processing system for nonuniformly encoded digital words as claimed in claim 2, in which said inverse normalizing means is composed of an adder.

8. A block digital processing system for nonuniformly encoded digital words as claimed in claim 7, in which said normalizing means is composed of a read-only memory.

* * * * *